United States Patent
Hsu et al.

(10) Patent No.: US 11,068,391 B2
(45) Date of Patent: Jul. 20, 2021

(54) MAPPING TABLE UPDATING METHOD FOR DATA STORAGE DEVICE

(71) Applicant: Silicon Motion, Inc., Jhubei (TW)

(72) Inventors: Kuei-Sung Hsu, Jhubei (TW); Jian-Wei Sun, Jhubei (TW); Ting-Heng Chou, Jhubei (TW)

(73) Assignee: Silicon Motion, Inc., Jhubei (TW)

( * ) Notice: Subject to any disclaimer, the term of this patent is extended or adjusted under 35 U.S.C. 154(b) by 53 days.

(21) Appl. No.: 16/542,311

(22) Filed: Aug. 16, 2019

(65) Prior Publication Data

US 2020/0081832 A1 Mar. 12, 2020

Related U.S. Application Data

(60) Provisional application No. 62/729,556, filed on Sep. 11, 2018.

(51) Int. Cl.
*G06F 12/00* (2006.01)
*G06F 12/02* (2006.01)
(Continued)

(52) U.S. Cl.
CPC .......... *G06F 12/0253* (2013.01); *G06F 3/064* (2013.01); *G06F 3/0619* (2013.01); *G06F 3/0625* (2013.01); *G06F 3/0659* (2013.01); *G06F 3/0679* (2013.01); *G06F 3/0689* (2013.01); *G06F 11/1076* (2013.01); *G06F 12/0246* (2013.01); *G06F 12/0802* (2013.01); *G11C 11/4063* (2013.01)

(58) Field of Classification Search
CPC ............ G06F 12/0253; G06F 11/1076; G06F 12/0246; G06F 12/0802; G06F 3/0625; G06F 3/0659; G06F 3/0679; G06F 3/064; G06F 3/0619; G06F 3/0689; G06F 2212/7205; G06F 2212/7201; G06F 3/0608; G06F 12/10; G11C 11/4063
USPC ........................................................ 711/154
See application file for complete search history.

(56) References Cited

U.S. PATENT DOCUMENTS

| | | | |
|---|---|---|---|
| 10,657,047 B2 * | 5/2020 | Lin | G06F 12/0246 |
| 2006/0184720 A1 * | 8/2006 | Sinclair | G06F 12/0246 |
| | | | 711/103 |
| 2007/0033325 A1 | 2/2007 | Sinclair | |

FOREIGN PATENT DOCUMENTS

| | | |
|---|---|---|
| CN | 104166634 A | 11/2014 |
| CN | 106326136 A | 1/2017 |

(Continued)

*Primary Examiner* — Mardochee Chery

(57) ABSTRACT

A mapping table updating method executable by a data storage device is provided. The data storage device includes a non-volatile memory and a controller. The mapping table updating method includes steps of: step A: configuring the controller to process a command issued by a host, and determine whether to trigger a partial garbage collection procedure when the command is a write command; when it is determined to trigger the partial garbage collection procedure, then performing step B: copying partial valid data in at least one source block to a destination block according to a segmentation condition; and step C: updating a logical-to-physical address mapping table of the data storage device according to a logical address of the copied partial valid data and a physical address in the destination block where the partial valid data is located, and returning to perform the step A.

3 Claims, 8 Drawing Sheets

(51) Int. Cl.
  *G06F 11/10*      (2006.01)
  *G06F 12/0802*    (2016.01)
  *G06F 3/06*       (2006.01)
  *G11C 11/4063*    (2006.01)

(56) References Cited

FOREIGN PATENT DOCUMENTS

| | | | |
|---|---|---|---|
| CN | 106802777 | A | 6/2017 |
| TW | M369528 | U1 | 11/2009 |
| TW | 201706848 | A | 2/2017 |
| TW | I591482 | B | 7/2017 |

\* cited by examiner

MAPPING TABLE UPDATING METHOD FOR DATA STORAGE DEVICE

FIELD OF THE INVENTION

The present invention relates to a mapping table updating method, and more particularly to a logical-to-physical address mapping table updating method capable of responding to a garbage collection (GC) procedure.

BACKGROUND OF THE INVENTION

Generally, a data storage device is composed of a controller and a non-volatile memory (e.g., flash memory). The non-volatile memory is mainly managed by a mapping table. For example, a logical-to-physical address mapping table is used to display the mapping relation between the logical address of a host terminal and the physical address of a non-volatile memory terminal. Therefore, how to maintain the mapping table is an essential subject in the field. Especially, there is a need in the art for a method to accurately update a logical-to-physical address mapping table when a data storage device copies valid data in the source block to the destination block according to the garbage collection procedure.

SUMMARY OF THE INVENTION

To achieve the above objective, an embodiment of the present invention provides a mapping table updating method executable by a data storage device. The data storage device includes a non-volatile memory and a controller. The mapping table updating method includes steps of: step A: configuring the controller to process a command issued by a host, and determine whether to trigger a partial garbage collection procedure when the command is a write command; when it is determined to trigger the partial garbage collection procedure, then performing step B: copying partial valid data in at least one source block to a destination block according to a segmentation condition; and step C: updating a logical-to-physical address mapping table of the data storage device according to a logical address of the copied partial valid data and a physical address in the destination block where the partial valid data is located, and returning to perform the step A.

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
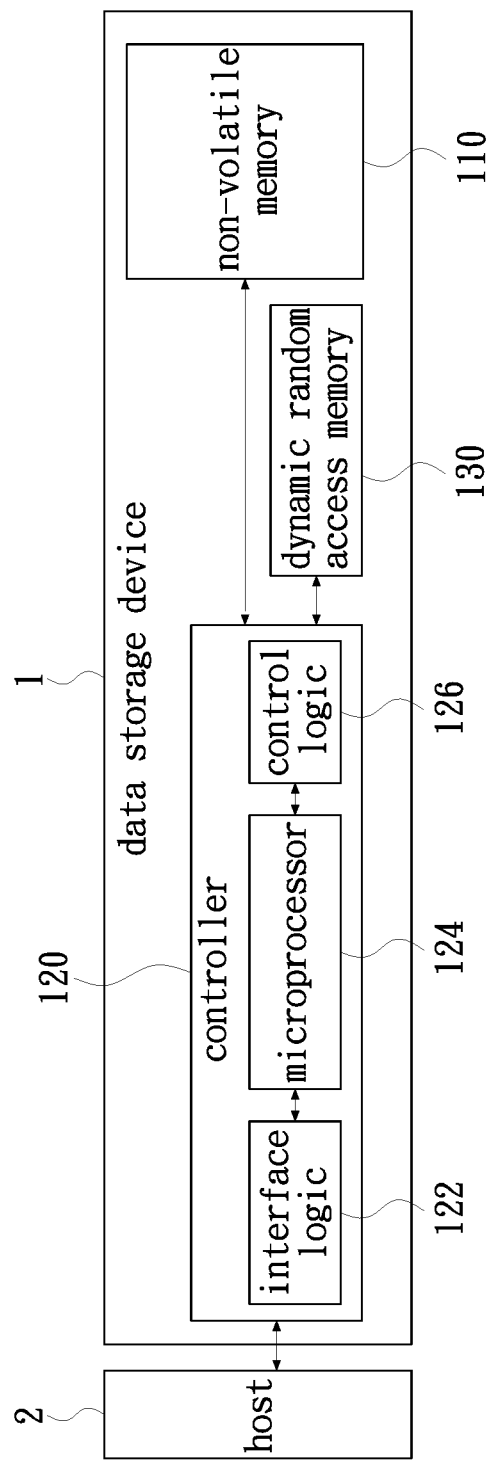
FIG. 1 is a schematic functional block view of a data storage device according to an embodiment of the present invention.

First, please refer to FIG. 1, which is a schematic functional block view of a data storage device according to an embodiment of the present invention. The data storage device 1 includes a non-volatile memory 110 and a controller 120. The non-volatile memory 110 includes a plurality of blocks (not shown). Each of the blocks includes a plurality of pages. Each of the pages is used to store one or more pieces of host data. In the embodiment, a piece of host data preferably has a size of 4 KB, but the embodiment is not limited thereto. In summary, the page is the smallest unit for data writing or data reading and the block is the smallest unit for data erasing. The blocks can be divided into spare blocks, active blocks and data blocks according to their function. The spare block is defined as a block that can be selected and written into data; the active block is defined as a block that has been selected and is being written into data; and the data block is defined as a block that has been written into data and data cannot be written therein anymore. It should be noted that the present invention does not limit the specific implementation of the blocks and the pages, and those skilled in the art should be able to perform related designs according to actual needs or applications. In addition, the non-volatile memory 110 in the embodiment is preferably implemented by flash memory, but the present invention is not limited thereto.

The controller 120 is electrically coupled to the non-volatile memory 110 and is used to control the data access in the non-volatile memory 110. It should be understood that the data storage device 1 is usually used with a host 2, and is configured to write the host data to the non-volatile memory 110 or read the host data from the non-volatile memory 110 according to the write/read command issued by the host 2. The controller 120 in the embodiment preferably is a flash controller and includes an interface logic 122, a microprocessor 124 and a control logic 126. The microprocessor 124 is electrically coupled to the interface logic 122 and the control logic 126, and is configured to receive write/read commands issued by the host 2 through the interface logic 122, and access the host data in the non-volatile memory 110 through the control logic 126. In addition, the data storage device 1 in the embodiment may further include a dynamic random access memory (DRAM) 130, which is electrically coupled to the controller 120 and used as a data buffer. Alternatively, in other embodiments, the controller 120 of the data storage device 1 may also directly use the DRAM (not shown) of the host 2 as a data buffer.

In order to perform the data management and access, the data storage device 1 is necessary to establish and store at least one mapping table, such as a logical-to-physical address mapping table. In the embodiment, the logical-to-physical address mapping table is simply referred to as an L2P table. When the data storage device 1 is in operation, the microprocessor 124 reads the L2P table from the non-volatile memory 110 and uploads the L2P table to the DRAM 130 or the DRAM of the host 2, so as to increase the efficiency of data management and access. However, for the data storage device 1 in which the DRAM 130 or the DRAM of the host 2 is not large enough to store an entire L2P table, that is, in the case where the DRAM 130 or the DRAM of the host 2 can only store a partial L2P table, the microprocessor 124 is necessary to frequently access the L2P table in the non-volatile memory 110 to swap or replace the partial L2P table temporarily stored in the DRAM 130 or in the DRAM of the host 2. Therefore, in order to efficiently manage the L2P table, the L2P table can be preferably divided into a plurality of sub-L2P tables, for example, 1024 sub-L2P tables. As such, the controller 120 can upload all or some of the sub-L2P tables to the DRAM 130 or the DRAM of the host 2 according to the size of the DRAM 130 or the DRAM of the host 2.

The logical address of the host side displayed by the L2P table can be implemented in various forms, such as a logical block address (LBA) or a global host page (GHP). The LBA and the GHP preferably respectively correspond to the host data of different sizes, such as 512 B and 4 KB host data. In addition, the L2P table is preferably established according to the sequence of the GHP, that is, the GHP can be an item (index) value, and the physical address of the non-volatile memory 110 is the content value of the item (index). As such, the size of the L2P table can be effectively reduced. In order to facilitate the following description, the L2P table in the present embodiment preferably uses the GHP as an index and records the physical address of the non-volatile memory 110 where the host data of each GHP is stored. That is, the L2P table records the physical the page of the block of the non-volatile memory 110 where the host data of each GHP is stored, but the present invention is not limited thereto.

Figure 2:
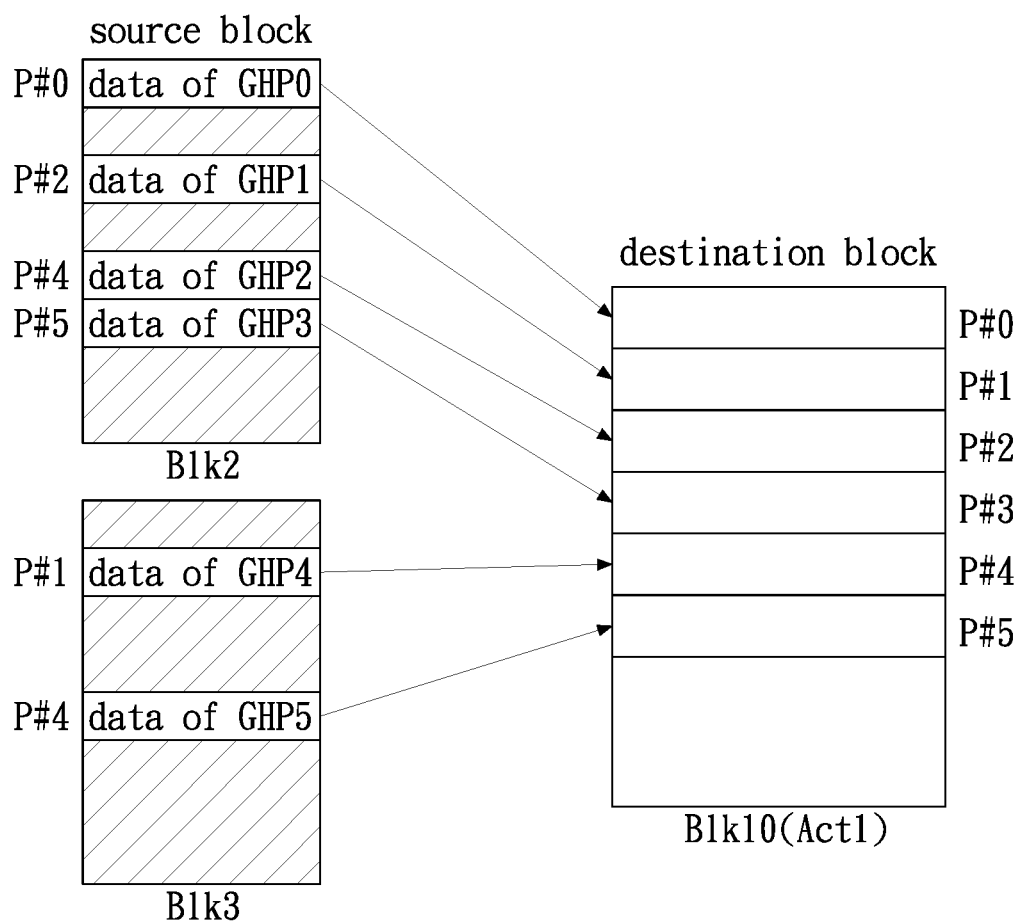
FIG. 2 is a schematic view showing an operation of a garbage collection procedure according to an embodiment of the present invention.

The non-volatile memory 110 has a special physical feature, that is, the update of data (i.e., data overwriting) is not performed on the same physical address, but the updated host data is written on the spare physical address and the GHP is corresponding to a new physical address, and accordingly the old host data on the original physical address can be converted into invalid data. As such, a frequent write operation may cause the non-volatile memory 110 to be filled with invalid data, and thus, the garbage collection procedure is developed accordingly. In the embodiment, the trigger condition for executing the garbage collection procedure may be, for example, that the total number of the spare blocks in the non-volatile memory 110 is lower than a first threshold, or the accessing number of any of the data blocks is higher than a second threshold, or the establishment time of any of the data blocks is longer than a third threshold, but the present invention is not limited thereto. In summary, the present invention does not limit the trigger condition for executing the garbage collection procedure, and those skilled in the art should be able to perform related designs according to actual needs or applications. FIG. 2 is used to illustrate the operation principle of the garbage collection procedure of the embodiment, wherein the invalid data is indicated by the oblique line portion in FIG. 2.

As shown in FIG. 2, when two data blocks (e.g., blocks Blk2 and Blk3) are successively selected as source blocks, the data storage device 1 continuously copies all valid data in the source blocks Blk2 and Blk3 (i.e., host data of GHP0 to GHP5) to the destination block (i.e., the block Blk10) selected in response to the garbage collection procedure, thereby completing the entire garbage collection procedure. It should be understood that the destination block Blk10 is preferably selected from a spare block pool (not shown) including a plurality of spare blocks, but the present invention is not limited thereto. The destination block Blk10 can be redefined as an active block when the garbage collection procedure is executed, and accordingly the label of the block Blk10 can be represented as Act1, but the present invention is not limited thereto. In addition, the data storage device 1 can further erase the source block Blk2 or Blk3 after all valid data in the source block Blk2 or Blk3 has been successfully copied, and accordingly the source block Blk2 or Blk3 are redefined as a spare block to release the storage space. Alternatively, in other embodiments, the data storage device 1 may first redefine the source block Blk2 or Blk3 as a spare block and then perform the erasing operation after the block Blk2 or Blk3 is selected as an active block. In summary, the present invention does not limit the specific implementation of erasing the source block, and those skilled in the art should be able to perform related designs according to actual needs or applications.

In order to simplify the complexity of the garbage collection procedure, in the conventional mapping table updating method, the data storage device 1 updates the logical address and the physical address in the destination block Blk10 to the L2P table "once and for all" after the destination block Blk10 has been filled with data and is redefined as a data block, that is, all valid data in the source blocks Blk2 and Blk3 has been successfully copied and the destination block Blk10 has been filled with data. However, the overall performance of the data storage device 1 may significantly decrease due to the data storage device 1 cannot process/respond to the write/read command issued by the host 2 during the updating of the L2P table. The decrease of the performance is more significant in the data storage device 1 provided with a small data buffer due to that the microprocessor 124 is necessary to frequently access the non-volatile memory 110 (i.e., to read the appropriate sub-L2P tables) and write the updated sub-L2P tables back to the non-volatile memory 110 during the updating of the L2P table, so the data storage device 1 will have a longer time not able to process/response to the write/read command issued by the host 2.

Figure 3:
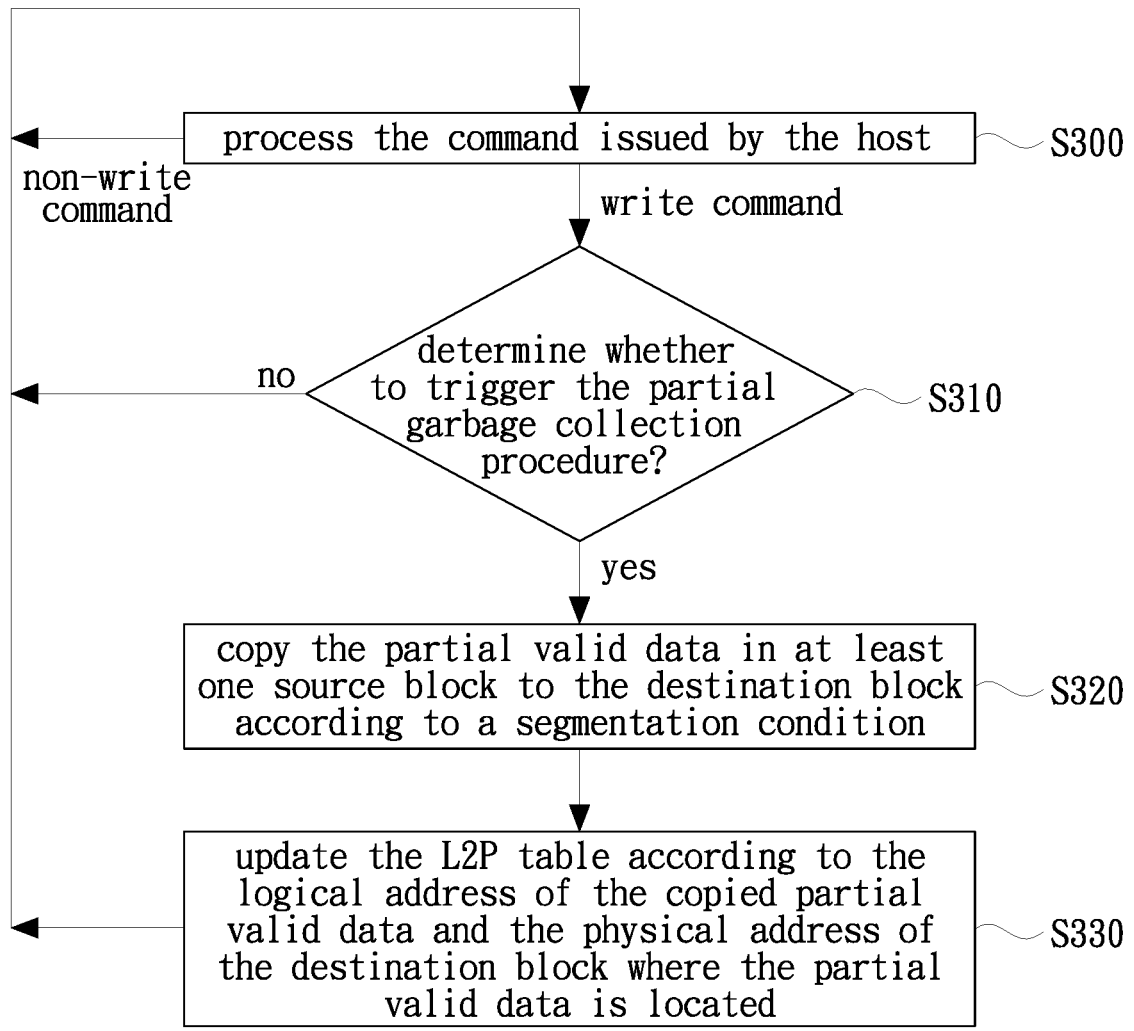
FIG. 3 is a schematic flowchart of a mapping table updating method according to an embodiment of the present invention.

FIG. 3 is a flowchart of a mapping table updating method according to an embodiment of the present invention. It should be noted that the mapping table updating method of FIG. 3 is executable by the data storage device 1 of FIG. 1, but the present invention does not limit that the mapping table updating method of FIG. 3 can only be executed by the data storage device 1 of FIG. 1. In addition, as mentioned above, the present invention does not limit the trigger condition for executing the garbage collection procedure. However, in order to process the write/read command issued by the host 2 in time, the garbage collection procedure in the embodiment may be executed in segments, and each segment of garbage collection procedure is also referred to as a partial garbage collection procedure, wherein the controller 120 can also process/response to the write/read command issued by the host 2 during the execution of the segment of garbage collection procedure. Please refer to FIG. 3. First, in step S300, the controller 120 processes the command issued by the host 2. Step S310 is thereafter performed if the command in Step S300 is a write command. Alternatively, step S300 is thereafter performed if the command in Step S300 is a non-write command. In step S310, the controller 120 determines whether to trigger the partial garbage collection procedure. If yes, step S320 is thereafter performed. Alternatively, if not, step S300 is thereafter performed.

In step S320, the controller 120 copies the partial valid data in at least one source block to the destination block according to a segmentation condition. Please also refer to FIG. 2. For example, the controller 120 may first copy two pieces of valid data in the source blocks Blk2 and Blk3 to the destination block Blk10 when step S320 is performed for the first time, and then the controller 120 may copy another two pieces of valid data in the source blocks Blk2 and Blk3 to the destination block Blk10 when step S320 is performed for the second time. Or, the controller 120 may first copy the valid data in 64 pages in the source blocks Blk2 and Blk3 to the destination block when step S320 is performed for the first time (wherein all or some of the 64 pages at the time may store valid data, but the present invention is not limited thereto), and then the controller 120 may copy the valid data in another 64 pages in the source blocks Blk2 and Blk3 to the destination block when step S320 is performed for the second time. In summary, the present invention does not limit the specific implementation of the segmentation condition, and those skilled in the art should be able to perform related designs according to actual needs or applications. In addition, the location of the destination block where the valid data is copied from the source block is preferably determined by the controller 120.

In step S320, the controller 120 may further establish a logical-to-physical address backup table. In the embodiment, the logical-to-physical address backup table is simply referred to as an L2P backup table for recording the logical address of the copied partial valid data and the physical address of the destination block where the partial valid data is located. In order to efficiently manage the L2P backup table, the controller 120 may preferably store the L2P backup table in a table block (not shown), and the table block is also selected from a spare block pool including a plurality of spare blocks, but the present invention is also not limited thereto. Thereafter, in step S330, the controller 120 updates the L2P table according to the logical address of the copied partial valid data and the physical address of the destination block where the partial valid data is located, and step S300 is thereafter performed. It is understood that when a certain host data is stored in a page of a certain active block, the controller 120 preferably records the logical address of the host data to the spare area or the end of block (EOB) of the active block. Then, after the active block is redefined as a data block and selected as a source block and when the host data is referred as valid data and copied to a destination block, the controller 120 preferably obtains the logical address of the host data from the above spare area or the EOB, and directly updates the L2P table according to the obtained logical address and the physical address of the destination block where the copied host data is located.

Figure 4A:
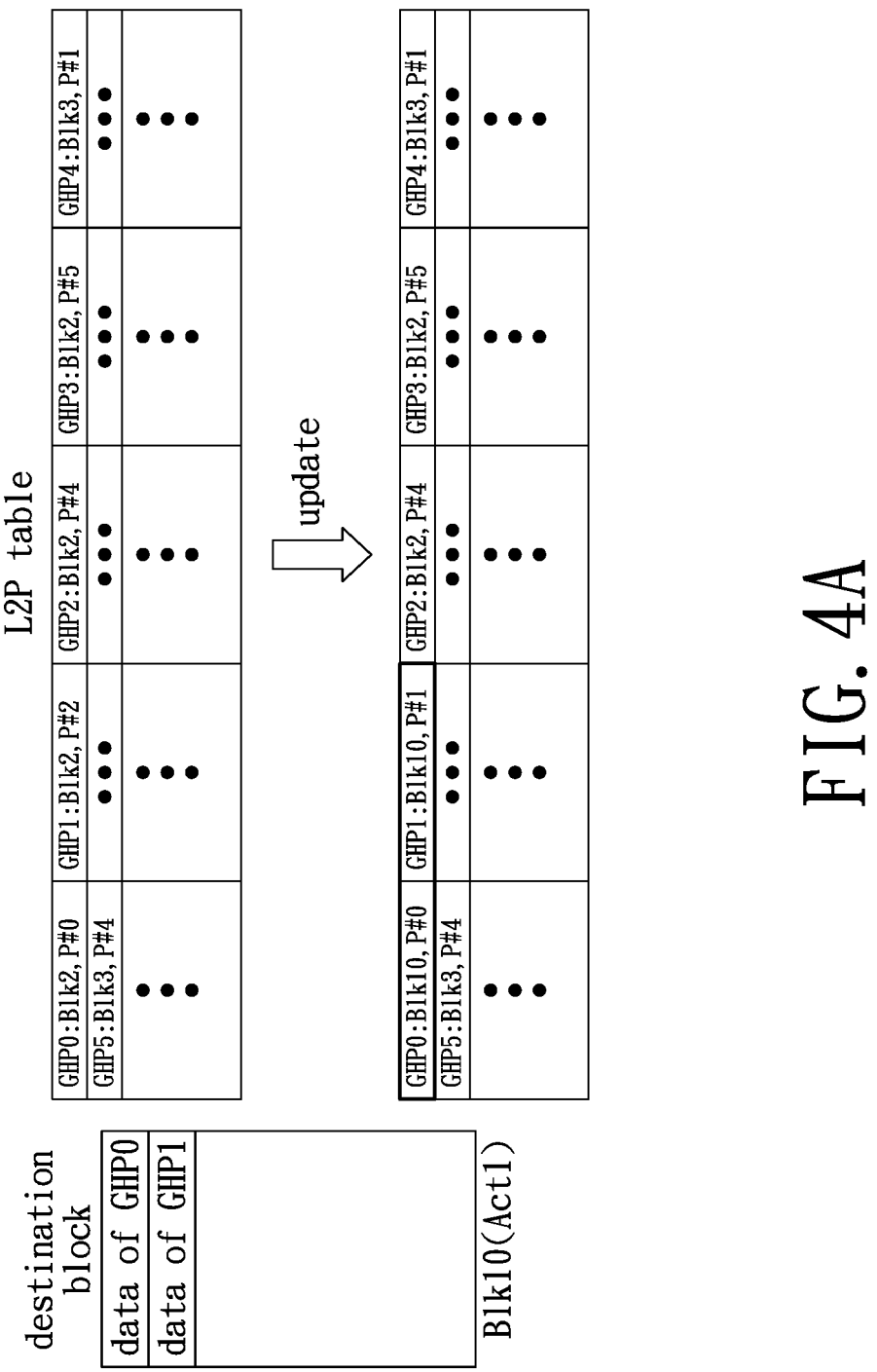
FIGS. 4A to 4C are schematic views showing an operation of steps S320 to S330 of the mapping table updating method of FIG. 3.
Figure 4B:
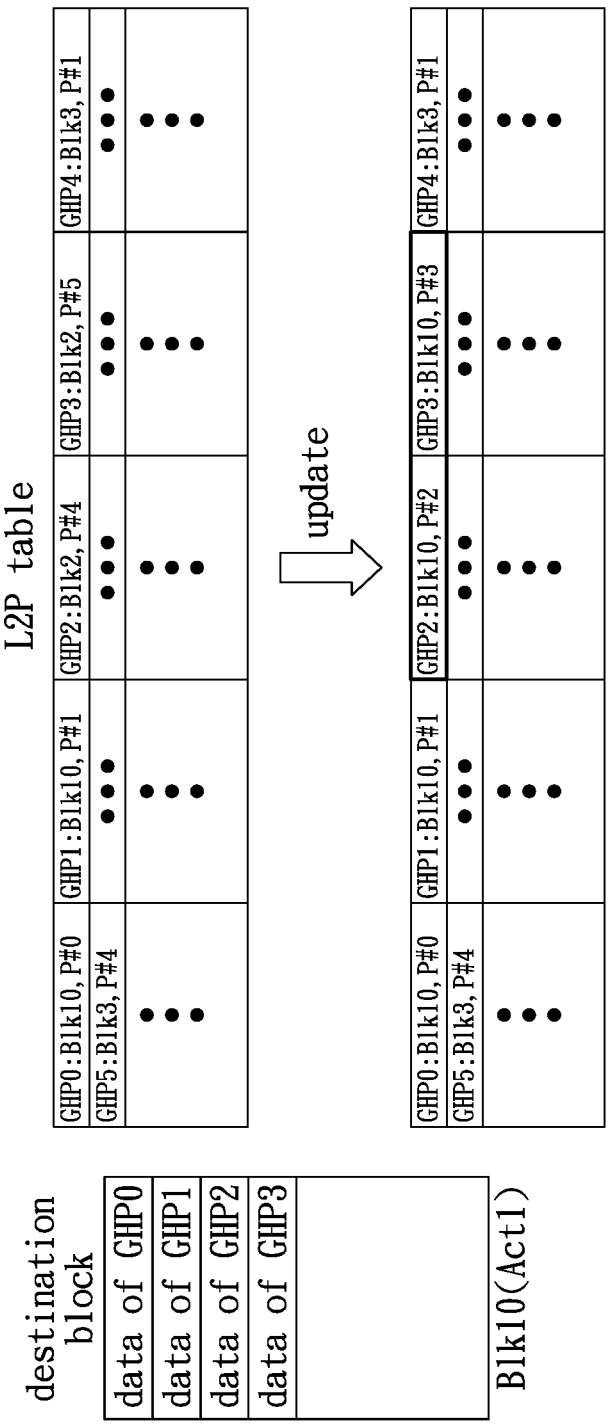
Figure 4C:
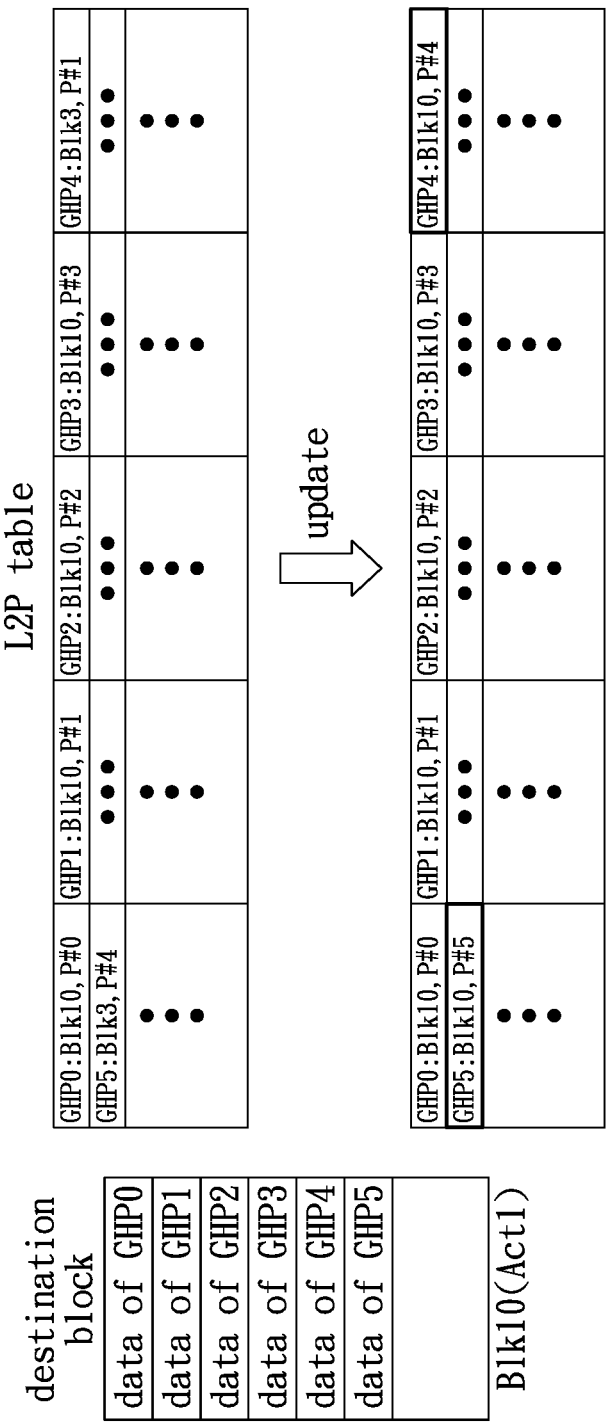

Specifically, the embodiment does not perform the subsequent step S310 but returns to step S300 if the command in step S300 is a non-write command. That is, the embodiment does not perform the subsequent step S310 until the command in step S300 is a write command. In addition, in order to facilitate the following description, the segmentation condition in step S320 of the embodiment is first defined as that only two pieces of valid data are copied into the destination block at a time, but the present invention is not limited thereto. Please refer to FIGS. 4A to 4C together. FIGS. 4A to 4C are schematic views of the operations of steps S320 to S330 of the mapping table updating method in FIG. 3, wherein FIGS. 4A to 4C adopt the source block as in FIG. 2 as an example, but the present invention is not limited thereto. As shown in FIG. 4A, after determining to trigger the first segmentation of partial garbage collection procedure, the controller 120 may copy two pieces of valid data in the source blocks Blk2 and Blk3 (e.g., host data of GHP0 to GHP1 in the source block Blk2) to the pages P #0 to P #1 in the destination block Blk10. Then, the controller 120 directly updates the L2P table according to the logical address of the copied host data and the physical address of the destination block Blk10 where the host data is located. That is, the current L2P table records a logical address in which it is indicated that the host data of GHP0 to GHP1 is stored in the pages P #0 to P #1 of the destination block Blk10, but the L2P backup table (not shown) still records a logical address in which it is indicated that the host data of GHP0 to GHP1 is stored in the pages P #0 and P #2 of the source block Blk2.

In order to prevent the data storage device 1 from continually executing the garbage collection procedure and therefore unable to respond to commands issued by the host 2, the controller 120 may turn to process other commands (e.g., read command) issued by the host 2 after the L2P table in FIG. 4A is updated. Then, the controller 120 will determine whether to trigger the second segmentation of the partial garbage collection procedure when the controller 120 processes the write command again (the next write command). In the embodiment, the controller 120 preferably performs a predetermined number of host commands before performing each segment of the partial garbage collection procedure, but the present invention is not limited thereto. That is, in the embodiment, the trigger condition for executing the partial garbage collection procedure may be, for example, that the amount of the processed host commands exceeds a preset number. Or, the controller 120 may perform step S320 again (i.e., perform the next segmentation of the partial garbage collection procedure) when the executing period of step S300 exceeds a preset period. In summary, the present invention does not limit the specific implementation in which the controller 120 processes the host commands and determines whether to trigger the execution of the each segment of the partial garbage collection procedure, those skilled in the art should be able to perform related designs according to actual needs or applications.

Next, as shown in FIG. 4B, when the controller 120 performs step S320 again (i.e., perform the second segmentation of the partial garbage collection procedure), the controller 120 copies another two pieces of the valid data in the source blocks Blk2 and Blk3 (e.g., the host data of GHP2 to GHP3 in the source block Blk2) to the pages P #2 to P #3 of the destination block Blk10. Then, the controller 120 directly updates the L2P table according to the logical address of the copied host data and the physical address of the destination block Blk10 where the host data is located. That is, the current L2P table records a logical address in which it is indicated that the host data of GHP2 to GHP3 is stored in the pages P #2 to P #3 of the destination block Blk10, but the L2P backup table (not shown) still records a logical address in which it is indicated that the host data of GHP2 to GHP3 is stored in the pages P #4 and P #5 of the source block Blk2.

Similarly, as shown in FIG. 4C, when the controller 120 performs step S320 still again (i.e., perform the third segmentation of the partial garbage collection procedure), the controller 120 copies another two pieces of the valid data in the source blocks Blk2 and Blk3 (e.g., the host data of GHP4 to GHP5 in the source block Blk3) to the pages P #4 to P #5 of the destination block Blk10. Then, the controller 120 directly updates the L2P table according to the logical address of the copied host data and the physical address of the destination block Blk10 where the host data is located. That is, the current L2P table records a logical address in which it is indicated that the host data of GHP4 to GHP5 is stored in the pages P #4 to P #5 of the destination block Blk10, but the L2P backup table (not shown) still records a logical address in which it is indicated that the host data of GHP4 to GHP5 is stored in the pages P #1 and P #4 of the source block Blk3.

In summary, the embodiment adopts the partial garbage collection procedure to segmentally copy the valid data in the source blocks Blk2 and Blk3 (e.g., host data of the GHP0 to GHP3 and GHP 4 to GHP5) to the destination block Blk10, and directly updates the L2P table of the data storage device 1 according to the copied partial valid data, instead of waiting for the destination block Blk10 to be filled with host data (e.g., after all the host data of the GHP0 to GHP5 has been copied successfully) to update the L2P table once and for all. In addition, the controller 120 may process the commands issued by the host 2 before performing each segment of the partial garbage collection procedure (or before performing the copy/update), thereby achieving the purpose of improving the overall performance degradation.

In other embodiment, the host data copied by the execution of the partial garbage collection procedure may be from different source blocks. Taking the source blocks Blk2 and Blk3 in FIG. 2 as an example and assuming that the segmentation condition is copying three pieces of valid data to the destination block Blk10 each time. Therefore, the controller 120 may copy the host data of GHP0 to GHP2 in the source block Blk2 to the destination block Blk10 when performing the first segmentation of the partial garbage collection procedure. Then, the controller 120 may copy the host data of GHP3 in the source block Blk2 and the host data of GHP4 to GHP5 in the source block Blk3 to the destination block Blk10 when performing the second segmentation of the partial garbage collection procedure. In summary, as described above, the present invention does not limit the specific implementation of the segmentation condition, and those skilled in the art should be able to perform related designs according to actual needs or applications.

Figure 5:
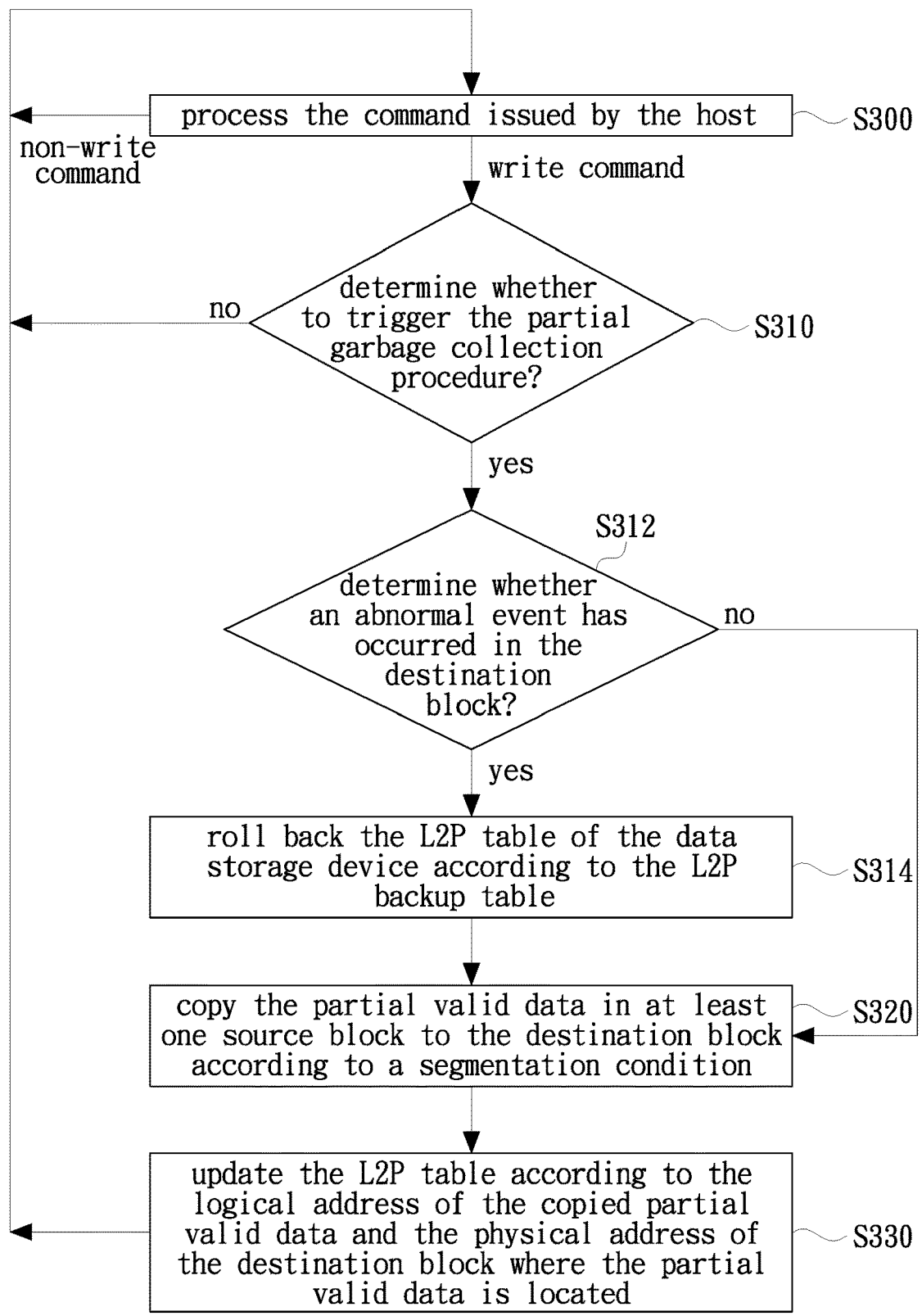
FIG. 5 is a schematic flowchart of a mapping table updating method according to another embodiment of the present invention.

The destination block Blk10 may be discarded due to an abnormal event, such as a power-off event or a write/read-back failure. Therefore, the mapping table updating method of the present invention may be further improved to avoid the problem. Please refer to FIG. 5, which is a schematic flowchart of a mapping table updating method according to another embodiment of the present invention. It should be noted that the mapping table updating method of FIG. 5 is also executable by the data storage device 1 of FIG. 1. However, the present invention does not limit that the mapping table updating method of FIG. 5 can only be executed by the data storage device 1 of FIG. 1. In addition, the same steps in FIG. 5 as those in FIG. 3 are denoted by the same reference numerals, and thus no redundant detail is to be given herein. Compared with step S310 in FIG. 3, the mapping table updating method of FIG. 5 may further include steps S312 and S314 after the controller 120 determines to trigger the partial garbage collection procedure.

In step S312, the controller 120 determines whether an abnormal event has occurred in the destination block. If yes, step S314 is performed first, and then steps S320 and S330 are thereafter performed; if not, steps S320 and S330 are directly performed. In step S314, the controller 120 rolls back the L2P table of the data storage device 1 according to the L2P backup table. That is, the rolling back of the L2P table is based on the logical address recorded in the L2P backup table, and the physical address (source block) corresponding to the logical address in the L2P backup table replaces the physical address (destination block) corresponding to the logical address in the L2P table.

Figure 6:
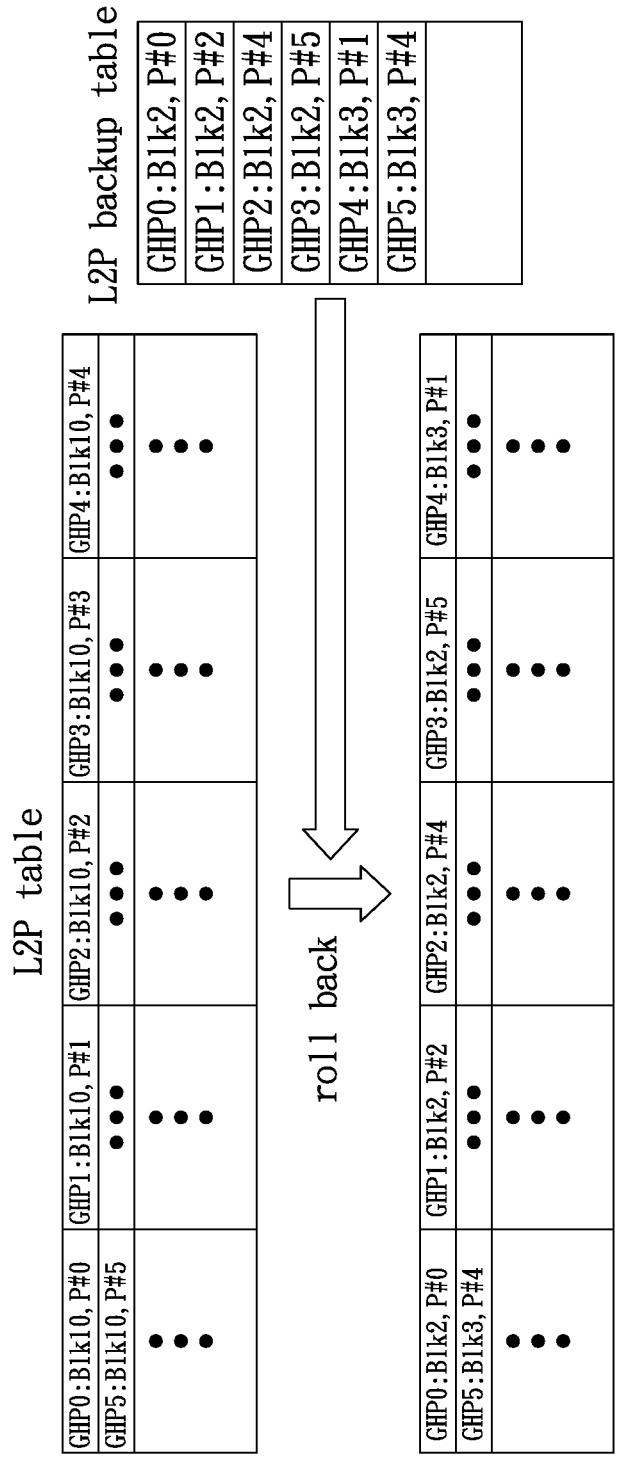
FIG. 6 is a schematic view showing an operation of rolling back an L2P table according to an L2P backup table in the mapping table updating method of FIG. 5.

FIG. 6 is a schematic view of an operation of the rolling back of the L2P table according to the L2P backup table in the mapping table updating method of FIG. 5. For example, after executing the partial garbage collection procedure, the controller 120 segmentally copies the host data of GHP0 to GHP5 in the source blocks Blk2 and Blk3 to the destination block Blk10, and directly and segmentally updates the L2P table. However, if an abnormal event occurs at this time and therefore the controller 120 has to discard the destination block Blk10, the controller 120 may roll back the L2P table of the data storage device 1 according to the L2P backup table, so that the L2P table is rolled back in which the mapping relationship between the logical address of the host data of the source blocks Blk2 and Blk3 and the physical address of the non-volatile memory 110 is recorded. Discarding the destination block Blk10 does not cause loss of host data or data management problems due to the mapping relationship between the logical address and the physical address is correctly rolled back (or replaced).

Since the destination block Blk10 has been discarded, in order to perform the partial garbage collection procedure, the controller 120 preferably selects another spare block (e.g., block Blk12, not shown) from a spare block pool as the new destination block. In the subsequent step S320, the controller 120 preferably executes the partial garbage collection program from the first segment thereof. That is, the controller 120 copies the host data of GHP0 to GHP1 in the block Blk2 to the (new) destination block Blk12 according to the segmentation condition, directly updates the L2P table, and then returns to process the command issued by the host 2 until performing step S320 again in which the controller 120 copies the host data of GHP2 to GHP3 in the block Blk2 to the destination block Blk12, and so on. In summary, before each performance of step S330, the controller 120 further uses the L2P backup table to back up the mapping relationship of the valid data about this copy recorded in the L2P table.

It should be understood that the resources or costs required establishing an L2P backup table are small; however, the establishment of L2P backup table can effectively overcome the technical problems caused by abnormal events. For example, in a data storage device 1 having a size of 256 GB, the size of the L2P table is 256 MB but the size of the L2P backup table may be less than 4 MB. In addition, the present invention does not limit the types of abnormal events, which may refer to power-off events, or write/read-back failures, etc. In general, those skilled in the art should be able to perform related designs according to actual needs or applications.

In summary, the mapping table updating method of the embodiments of the present invention adopts the partial garbage collection procedure to segmentally copy the valid data in the at least one source block to the destination block, and directly updates the L2P table of the data storage device according to the copied partial valid data, instead of waiting for all the valid data in the source block has been successfully copied to update the L2P table once and for all. In addition, the commands issued by the host may be processed before each segment of the partial garbage collection procedure is performed, thereby achieving the purpose of improving the overall performance degradation. In addition, before performing each copy (or referred to as before executing each segment of the partial garbage collection procedure), the mapping table updating method of the embodiments of the present invention will check whether the L2P table has to be rolled back according to the established L2P backup table to prevent the updated L2P table from pointing to the destination block that was discarded due to a sudden power-off event or a write/read-back failure. In addition, before performing each update, the mapping table updating method of the embodiments of the present invention uses the L2P backup table to back up the mapping relationship for valid data for this copy record in the L2P table.

The above description is only an embodiment of the present invention, and is not intended to limit the scope of the invention.

What is claimed is:

1. A mapping table updating method executable by a data storage device, the data storage device comprising a non-volatile memory and a controller, and the mapping table updating method comprising steps of:
   step A: configuring the controller to process a command issued by a host, and determine whether to trigger a partial garbage collection procedure when the command is a write command;
      when it is determined to trigger the partial garbage collection procedure, then determining whether an abnormal event has occurred in a destination block;
      when it is determined that the abnormal event has occurred in the destination block, performing step A1: rolling back a logical-to-physical address mapping table according to a logical-to-physical address backup table, and then performing steps B and C; and
      when it is determined that the abnormal event has not occurred in the destination block, directly performing the steps B and C;
   step B: copying partial valid data in at least one source block to the destination block according to a segmentation condition, and establishing the logical-to-physical address backup table for recording a logical address of the copied partial valid data and a physical address of the partial valid data in the source block; and
   step C: updating the logical-to-physical address mapping table of the data storage device according to the logical address of the copied partial valid data and the physical address in the destination block where the partial valid data is located, and returning to perform the step A.

2. The mapping table updating method according to claim 1, wherein the non-volatile memory comprises a plurality of blocks, each of the plurality of blocks comprises a plurality of pages, the plurality of blocks are divided into spare blocks, active blocks and data blocks, the at least one source block is selected from the plurality of data blocks, and the destination block is selected from the plurality of spare blocks.

3. The mapping table updating method according to claim 1, wherein the abnormal event comprises a power-off event or a write/read-back failure.

* * * * *